United States Patent

Lang et al.

[11] Patent Number: 5,936,991
[45] Date of Patent: Aug. 10, 1999

[54] NEAR FIELDS IN FLARED MOPAS AMPLIFIERS AND OSCILLATORS BY LATERAL CURRENT TAILORING

[75] Inventors: Robert J. Lang, Pleasanton; David A. Mehuys; Steve O'Brien, both of Sunnyvale; Jo Major, San Jose, all of Calif.

[73] Assignee: The United States of America as represented by the Secretary of the Air Force, Washington, D.C.

[21] Appl. No.: 08/718,056

[22] Filed: Sep. 17, 1996

[51] Int. Cl.$^6$ .............................. H01S 3/19; H01S 3/00
[52] U.S. Cl. ........................... 372/50; 372/45; 359/344
[58] Field of Search .................... 372/43–46, 50, 372/75, 84, 96; 359/344

[56] References Cited

U.S. PATENT DOCUMENTS

| | | | |
|---|---|---|---|
| 4,965,525 | 10/1990 | Zah | 330/4.3 |
| 5,175,643 | 12/1992 | Andrews | 372/50 X |
| 5,321,718 | 6/1994 | Waarts et al. | 372/108 |
| 5,337,328 | 8/1994 | Lang et al. | 372/45 |
| 5,657,339 | 8/1997 | Fukunaga | 372/45 |

Primary Examiner—Rodney B. Bovernick
Assistant Examiner—Luong-Quyen T. Phan
Attorney, Agent, or Firm—William G. Auton

[57] ABSTRACT

Conventional master oscillator power amplifier (MOPA) devices have experienced poor beam quality due to edge effects. The lateral current tailoring described herein was one attempt at improving the laser beam quality. Experimental results have indicated that this approach can make improvement in beam quality, using nonlinear leading edges in the gain stripe of MOPA amplifiers.

3 Claims, 3 Drawing Sheets

NEAR FIELDS IN FLARED MOPAS AMPLIFIERS AND OSCILLATORS BY LATERAL CURRENT TAILORING

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to amplifiers, and more specifically the invention pertains to laser diodes. The invention also relates to high power laser diodes of the type known as master oscillator power amplifier (MOPA) devices, and especially to MOPAs with flared amplifiers.

Conventional "hard-edged" amplifiers produce top-hat near fields with appreciable structure due to edge effects. These systems have experienced relatively poor beam quality due to edge effects of the "hard-edged" flared amplifiers which contribute to the near fields of their laser diode components. The task of feathering out the near field effects to improve beam quality is alleviated, to some extent, by the systems described in the following U.S. patents, the disclosures of which are incorporated herein by reference:

U.S. Pat. No. 5,321,718 issued to Waarts et al;
U.S. Pat. No. 4,965,525 issued to Zah; and
U.S. Pat. No. 5,337,328 issued to Lang.

The above-cited patents disclose semiconductor laser designs that are improved by the present invention.

SUMMARY OF THE INVENTION

The present invention includes a laser amplifier which receives and amplifies an optical signal to produce thereby an amplified laser signal. One embodiment of this invention includes: a light amplifying device composed of a semiconductor body which has a resonator and amplifying section; contact areas that provide a pumping current to the resonator; and loading edges which are on opposite sides of the contact areas, and which have a nonlinear pattern along a portion of their lengths. The nonlinear pattern can be a sinusoidal or saw-toothed pattern.

The present invention can also be considered a process of improving the light emission profile in the near and far field provided as output from a semiconductor gain device having a semiconductor body with a stable or unstable resonator therein, a portion of the resonator having a lateral dimension which is larger at its output than some other portion of the resonator. This method is composed from the steps of: providing a pumping current configuration for at least part of the length of the resonator portion having edges that laterally diverge relative to the length; and forming a nonlinear pattern along the edges wherein the nonlinear pattern is formed to have a sinusoidal or saw-toothed in configuration along the edges.

It is an object of the present invention to improve the near field performance of MOPA devices.

It is another object of the present invention to provide a new design for flared MOPAs using nonlinear leading edges in the gain stripe.

These objects together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes an improved design for flared MOPA amplifiers.

Figure 1:
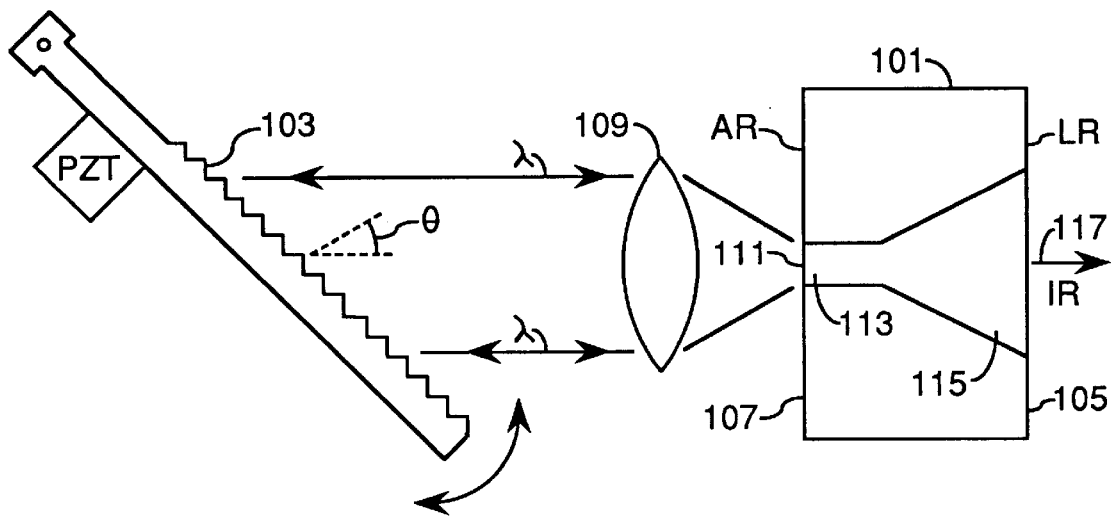
FIGS. 1 and 2 present two views of prior art MOPA devices.
Figure 2:
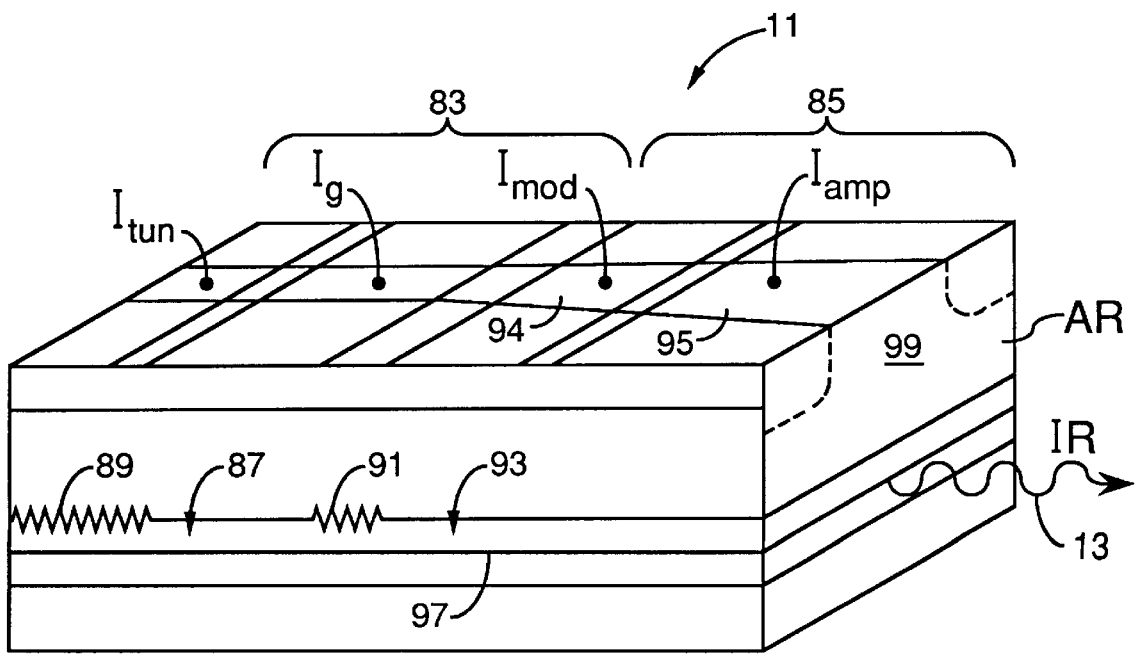

FIGS. 1 and 2 respectively provide a plan view and a perspective view of a prior art "hard-edge" master oscillator power amplifier (MOPA) with a "hard-edge" gain stripe, as described in the above-cited Waarts et al patent. As discussed in this patent, the (MOPA) type or flared resonator type laser diode is used for generating one or more high power coherent light beams of at least a first wavelength. An optical frequency converter may be positioned to receive the beam or beams from the high power laser diode or diodes for generating an output light beam of a different wavelength from a portion of the optical power of the beam or beams from the laser diode or diodes. The MOPA type laser diode preferably includes a single mode, tunable DBR laser oscillator coupled to a multimode, preferably flared, power amplifier region. By removing the internal DBR grating from the laser oscillator, the flared amplifier region itself can be made to oscillate as an at most, marginally stable resonator with spatial mode filter, producing a high power diffraction limited output beam.

The laser diode 101 of FIG. 1 is from the above-cited Waarts et al patent and could be used for frequency doubling with a flared resonator type laser diode that includes a light amplifying diode heterostructure 101 located within an at most marginally stable resonant optical cavity defined by a tunable grating reflector 103 and a low reflection front end facet 105 of the heterostructure 101. The rear end facet 107 of the heterostructure 101 is antireflection (AR) coated to prevent self-oscillation of the heterostructure 101. A lens 109 between the grating reflector 103 and AR coated rear facet 107 of the heterostructure 101 receives light emitted from a narrow single-mode aperture 111 defined by a waveguide 113 in the heterostructure 101 and collimates and directs the light toward the grating reflector 103 at an incidence angle θ. The single mode aperture 111 forms a spatial mode filter for the light oscillating in the cavity. The lens 109 also receives the reflected light back from the grating reflector 103 and focuses it upon the rear facet 107, coupling light of a particular wavelength λ corresponding to the incidence angle θ of light on the grating 103 through the narrow aperture 111 into the single mode waveguide 113. The heterostructure 101 has a flared gain region 115 which is electrically pumped to amplify the light received from the waveguide 113 as it freely diffracts within the divergence of flared gain region 115. A coherent red or near infrared light beam 117 of wavelength λ is emitted from the front facet 105 of the heterostructure 101.

FIG. 2 is a perspective view of the flared MOPA amplifier of the above-cited Waarts et al patent. Typically the MOPA device 11 emits 1 W cw of single frequency optical power. Alternatively, the MOPA device 11 would be operated in a pulsed mode to provide about 3 W peak output power for even higher conversion efficiencies than the continuous wave (cw) mode of operation. A preferred MOPA device capable of generating such power levels comprises a low power, single-mode DBR laser oscillator 83 which is integrated with a multimode, preferably flared, power amplifier region 85. A typical power output from the laser oscillator section 83 is about 50 mW. The laser oscillator 83 has a single mode waveguide region 87 (represented by stripe or surface contact 94A) driven by an electrical pump current $I_g$ and bounded by a pair of grating reflectors 89 and 91 defined in a layer interface proximate to the waveguide layers 87A and 87B so as to interact with lightwaves propagating therein and form an optical resonator. The highly reflective rear grating reflector 89 may be wavelength tunable by means of an injection current $I_{tun}$ or electrical bias applied across the grating region. The front grating reflector 91 is partially transmissive to the propagating light in the waveguide region 87 to couple the light into the amplifier region 85. The amplifier region has waveguiding layers 93 that are driven by at least an amplifier current $I_{amp}$ applied through the conductive surface contact 95. Light coupled from the laser oscillator 83 into the waveguiding layers 93 of the amplifier region 85 are allowed to freely diverge in the lateral direction parallel to the plane of the active region 97 as it propagates toward the AR-coated output facet 99.

In FIG. 2, the amplifier region 85 has two split contacts 94 and 95 for optimization of the current density as a function of the length of the flared portion of region 85. The wider front half of the amplifier region 85 could thus be pumped with a greater amplifier current $I_{amp}$ and current density than the narrower back half of the amplifier region 85 near the laser oscillator 83. Such differential pumping reduces amplitude noise in the output signal 13, and also improves the spatial mode quality of the output since optical filamentation is minimized. Another advantage of the split contacts 94 and 95 is that the MOPA device 11 can be modulated by means of a modulation current $I_{mod}$ applied to the first part of the flared amplifier 85 through contact 94. Output power can then be modulated without inducing wavelength chirp in the laser oscillator output, which would adversely affect phase matching in a nonlinear crystal. Further, modulation can then be accomplished at gigahertz frequencies with only modest input current $I_{mod}$, since the optical power on the narrow end of the flared amplifier region 85 is still only a few hundred milliwatts.

Figure 3:
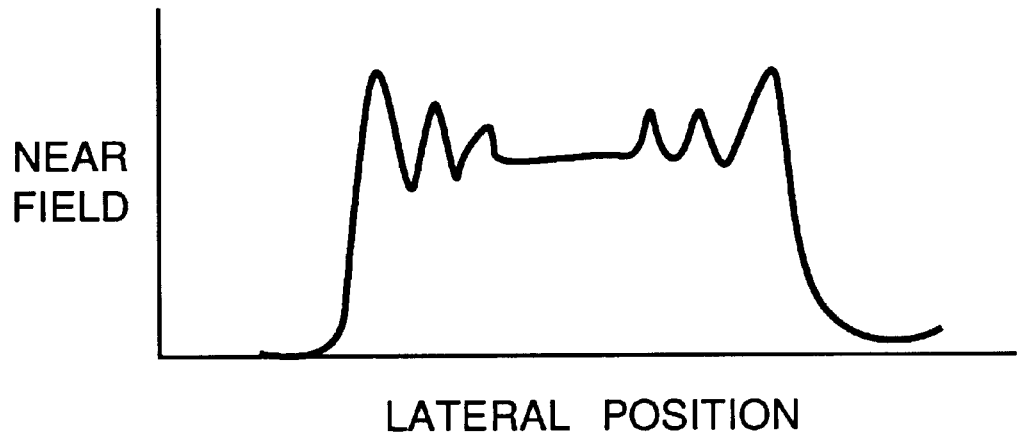
FIG. 3 is a chart of the near field performance of the device of FIGS. 1 and 2.

Conventional "hard-edge" flared amplifiers produce top-hat near fields with appreciable structure due to edge effects as illustrated in FIG. 3. FIG. 3 is a chart of the near field produced by the laser amplifiers of FIGS. 1 and 2. In general such systems have experienced poor beam quality due to edge effects. The lateral current tailoring of the present invention was one attempt at improving the laser beam quality.

Figure 5:
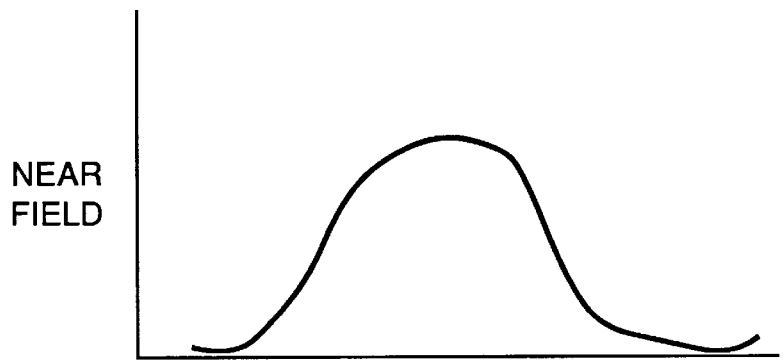
FIG. 5 is a chart of the near field performance of the device of FIG. 4.

Numerical calculations have shown that by "feathering out" the contact current laterally, i.e., having it drop off over a distance of 10–50, the near field assumes a more Gaussian profile, with concomitant improvements in the far field and less filamentation as illustrated in FIG. 5.

Figure 4:
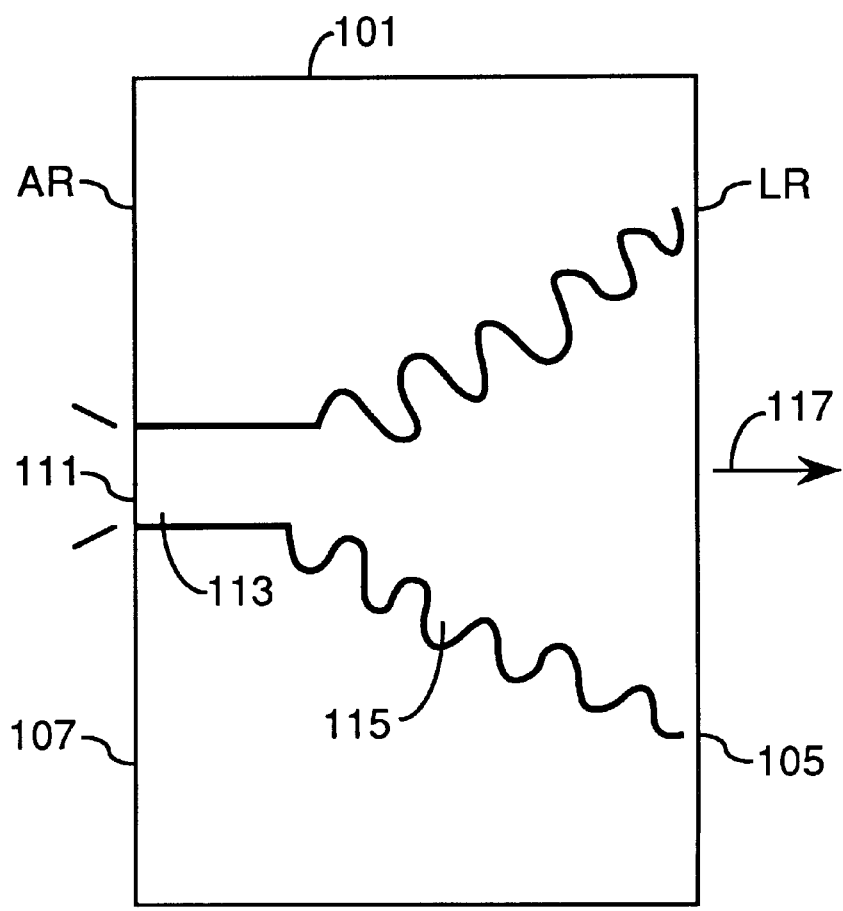
FIGS. 4 and 6 present two views of the improved MOPA device of the present invention.

FIG. 4 is a plan view of the "soft-edged" gain stripe laser amplifier of the present invention. The "soft-edge" is an alternative to the linear flare shape of the gain stripe used in the amplifier of FIG. 1, and is defined by a stripe lateral leading edges having a nonlinear edges are sinusoidal, saw-toothed, square-shaped or other non-linear flared or diverging boundaries which improve the profile of the near field pattern. The features of the non-linear leading edge should be determined empirically on a case-by-case basis depending upon the application involved, but the irregular gain stripe geometry has epitaxial layers that can be formed by the principles of such standard texts as "Semiconductor Lasers and Heterojunction LEDs" by Henry Kressel et al, the disclosure of which is incorporated herein by reference.

Figure 6:
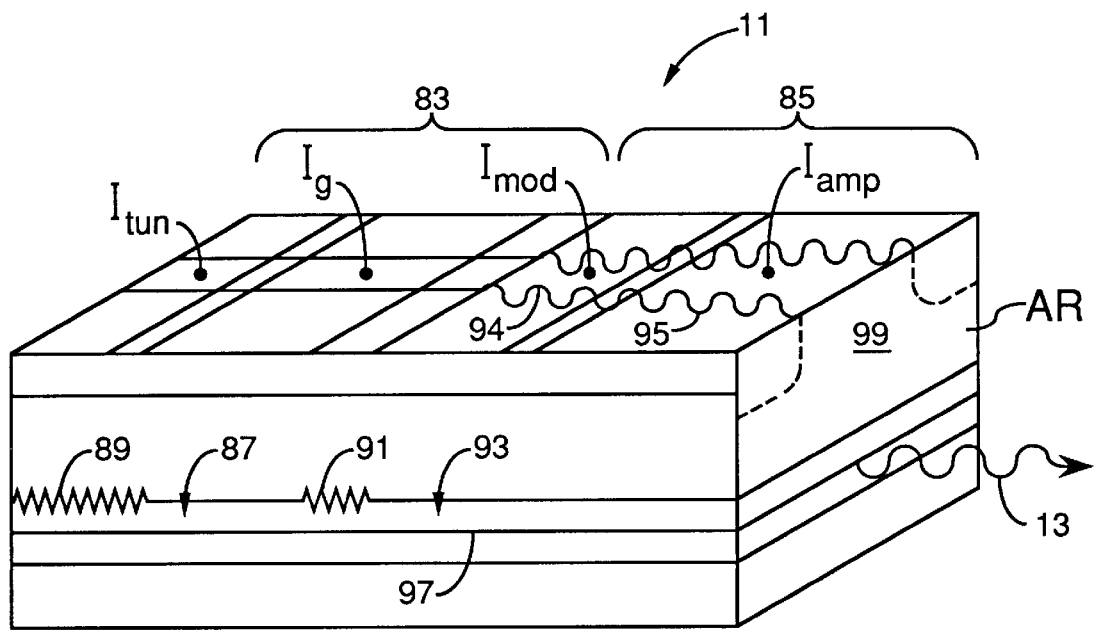

FIG. 5 is a chart of the near field pattern produced by the laser amplifiers of FIGS. 4 and 6. As discussed above, the soft-edge flared amplifiers of FIGS. 4 and 6 have concomitant improvements in far field performance and less filamentation. For this reason, the present invention can also be considered a process of improving near fields in flared MOPAs by substituting a use of a soft-edged, non-linear gain-stripe design in place of the hard-edged flared amplifiers. This soft-edged amplifier has either a sinusoidal, saw-toothed or other non-linear edge.

FIG. 6 is a perspective view of the laser amplifier design of the present invention in which all the layers resemble that of FIG. 1 with the exception of the soft-edge gain stripe feature 95. The modulating signal enters the waveguide section of the gain stripe at $I_{tun}$, and is modulated and amplified respectively via contacts 94 and 95 at $I_{mod}$ and $I_{amp}$. Also, modulating section at contact 94 may be formed as an absorbing section as taught to the patent to Andrews, U.S. Pat. No. 5,175,643, which patent is incorporated herein by reference thereto. Both the laser oscillator section 83 and the power amplifier section 85 are other soft-edged design with the non-linear leading edge described above. Both the power amplifier 85 and the laser modulator 83 portion of the flare have the non-linear leading edge that may be sinusoidal, saw-toothed or other non-linear edge that improves the near field and far field performance as described above.

While the preferred embodiment shown in FIGS. 4 and 6 relates to a flared or tapered device, contact means having a nonlinear pattern provided along appropriate edges of such devices maybe also applied to other broad area devices defined as part of a resonator for light propagation and amplification with a portion of the resonator having a lateral dimension which is larger at its output then some other portion of the resonator in the device structure. Therefore, this invention is not limited to just an amplifying device having a flared geometry.

What is claimed is:

1. A light amplifying device comprising:
   a semiconductor body having a resonator with a portion of said resonator having a lateral dimension which is larger at its output than some other portion of said resonator; said portion of said resonator constituting an amplifying section and optically coupled to at least one other section therein;
   contact means for providing pumping current to at least a portion of said resonator portion; and
   edge portions along opposite sides of said contact means characterized by having a nonlinear pattern along at least a portion of their lengths, wherein said nonlinear pattern of the edge portions extends upon the full edge of the edge portions, and wherein said nonlinear pattern is sinusoidal in configuration.

2. The light amplifying device of claim 1 wherein said device includes an optical cavity external of said device and optically coupled to said resonator.

3. The light amplifying device of claim 2, further including means to tune the operating wavelength of said device in said external cavity.

\* \* \* \* \*